(12) United States Patent
Hagai et al.

(10) Patent No.: US 8,504,366 B2
(45) Date of Patent: Aug. 6, 2013

(54) JOINT FACTOR ANALYSIS SCORING FOR SPEECH PROCESSING SYSTEMS

(75) Inventors: Aronowitz Hagai, Petah-Tikva (IL); Barkan Oren, Rishon Lezion (IL)

(73) Assignee: Nuance Communications, Inc., Burlington, MA (US)

( * ) Notice: Subject to any disclaimer, the term of this patent is extended or adjusted under 35 U.S.C. 154(b) by 0 days.

(21) Appl. No.: 13/297,294

(22) Filed: Nov. 16, 2011

(65) Prior Publication Data

US 2012/0065974 A1 Mar. 15, 2012

Related U.S. Application Data

(63) Continuation of application No. 11/311,756, filed on Dec. 19, 2005, now Pat. No. 7,594,200.

(51) Int. Cl.
*G10L 17/00* (2006.01)
*G10L 15/06* (2006.01)
*G10L 15/28* (2006.01)
*H04R 29/00* (2006.01)
*G06K 9/00* (2006.01)

(52) U.S. Cl.
USPC ........... 704/246; 704/250; 704/255; 704/243; 381/56; 382/181

(58) Field of Classification Search
USPC ................. 704/250, 255, 243, 246
See application file for complete search history.

(56) References Cited

U.S. PATENT DOCUMENTS

2009/0119103 A1* 5/2009 Gerl et al. ........... 704/243
2010/0114573 A1* 5/2010 Huang et al. ........... 704/250
2011/0040561 A1* 2/2011 Vair et al. ........... 704/240
2011/0251843 A1* 10/2011 Aronowitz ........... 704/235

OTHER PUBLICATIONS

O. Glembek, L. Burget, N. Brummer, and P. Kenny, "Comparison of scoring methods used in speaker recognition with joint factor analysis," in Proc. IEEE Int. Conf. Acoust., Speech, Signal Process., Taipei, Taiwan, Apr. 2009, pp. 4057-4060.*
IEEE Transactions on Audio, Speech, and Language Processing, vol. 15, No. 7, September 2007, A Joint Factor Analysis Approach to Progressive Model Adaptation in Text-Independent Speaker Verification by Shou-Chun Yin, Richard Rose, and Patrick Kenny.*
IEEE Transactions on Audio, Speech, and Language Processing, vol. 15, No. 4, May 2007, Joint Factor Analysis Versus Eigen channels in Speaker Recognition by Patrick Kenny, Gilles Boulianne, Pierre Ouellet and Pierre Dumouchel.*
Kenny et al., "A Study of Inter-Speaker Variability in Speaker Verification", IEEE Transactions on Audio, Speech and Language Processing, Jul. 2008.
Guo, Wu et al., "Simplified Channel Factor Estimates in Speaker Verification", Qinghua Daxue Xuebao/Journal of Tsinghua University, v 48, n Suppl., p. 664-667, Apr. 2008.

* cited by examiner

*Primary Examiner* — Pierre-Louis Desir
*Assistant Examiner* — Neeraj Sharma
(74) *Attorney, Agent, or Firm* — Hamilton, Brook, Smith & Reynolds, P.C.

(57) ABSTRACT

Method, system, and computer program product are provided for Joint Factor Analysis (JFA) scoring in speech processing systems. The method includes: carrying out an enrollment session offline to enroll a speaker model in a speech processing system using JFA, including: extracting speaker factors from the enrollment session; estimating first components of channel factors from the enrollment session. The method further includes: carrying out a test session including: calculating second components of channel factors strongly dependent on the test session; and generating a score based on speaker factors, channel factors, and test session Gaussian mixture model sufficient statistics to provide a log-likelihood ratio for a test session.

14 Claims, 3 Drawing Sheets

JOINT FACTOR ANALYSIS SCORING FOR SPEECH PROCESSING SYSTEMS

BACKGROUND

This invention relates to the field of joint factor analysis scoring. In particular, the invention relates to joint factor analysis scoring for speech processing systems.

Joint factor analysis (JFA) is a statistical modelling framework (it is a statistical version of factor analysis) widely used by state-of-the-art speech processing systems for tasks such as, for example, speaker verification, speaker authentication, speaker recognition, language identification, and emotion detection. The description is given in the context of the speaker verification task; however, the described method and system may be applied to other speech processing tasks.

JFA is used by automatic speaker authentication/verification/recognition to model the voice of an enrolled speaker, and to score verification utterances against an enrolled speaker. See, for example, Kenny, P., Ouellet, P., Dehak, N., Gupta, V., and Dumouchel, P. "A Study of Inter-Speaker Variability in Speaker Verification" IEEE Transactions on Audio, Speech and Language Processing, July 2008.

JFA is very accurate and the scoring process takes 1-2 seconds on a powerful machine to perform a single scoring process.

BRIEF SUMMARY

According to a first aspect of the present invention there is provided a computer-implemented method for Joint Factor Analysis (JFA) scoring in speech processing systems performed by a computerized device, comprising: carrying out an enrolment session offline to enrol a speaker model in a speech processing system using JFA, including: extracting speaker factors from the enrolment session; estimating first components of channel factors from the enrolment session; carrying out a test session including: calculating second components of channel factors strongly dependent on the test session; and generating a score based on speaker factors, channel factors, and test session Gaussian mixture model sufficient statistics to provide a log-likelihood ratio for a test session.

According to a second aspect of the present invention there is provided a computer program product or Joint Factor Analysis (JFA) scoring in speech processing systems, the computer program product comprising: a computer readable non-transitory storage medium having computer readable program code embodied therewith, the computer readable program code comprising: computer readable program code configured to: carry out an enrolment session offline to enrol a speaker model in a speech processing system using JFA, including: extracting speaker factors from the enrolment session; estimating first components of channel factors from the enrolment session; carry out a test session including: calculating second components of channel factors strongly dependent on the test session; and generate a score based on speaker factors, channel factors, and test session Gaussian mixture model sufficient statistics to provide a log-likelihood ratio for a test session.

According to a third aspect of the present invention there is provided a system for Joint Factor Analysis (JFA) scoring in a speech processing system, comprising: a processor; an enrolment system for carrying out an enrolment session offline to enrol a speaker model in a speech processing system using JFA, including: a speaker factor module for extracting speaker factors from the enrolment session; an estimating module for estimating first components of channel factors from the enrolment session; a test system for carrying out a test session including: a calculating module for calculating second components of channel factors strongly dependent on the test session; and a scoring system for generating a score based on speaker factors, channel factors, and test session Gaussian mixture model sufficient statistics to provide a log-likelihood ratio for a test session.

BRIEF DESCRIPTION OF THE SEVERAL VIEWS OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings in which:

Figure 1:
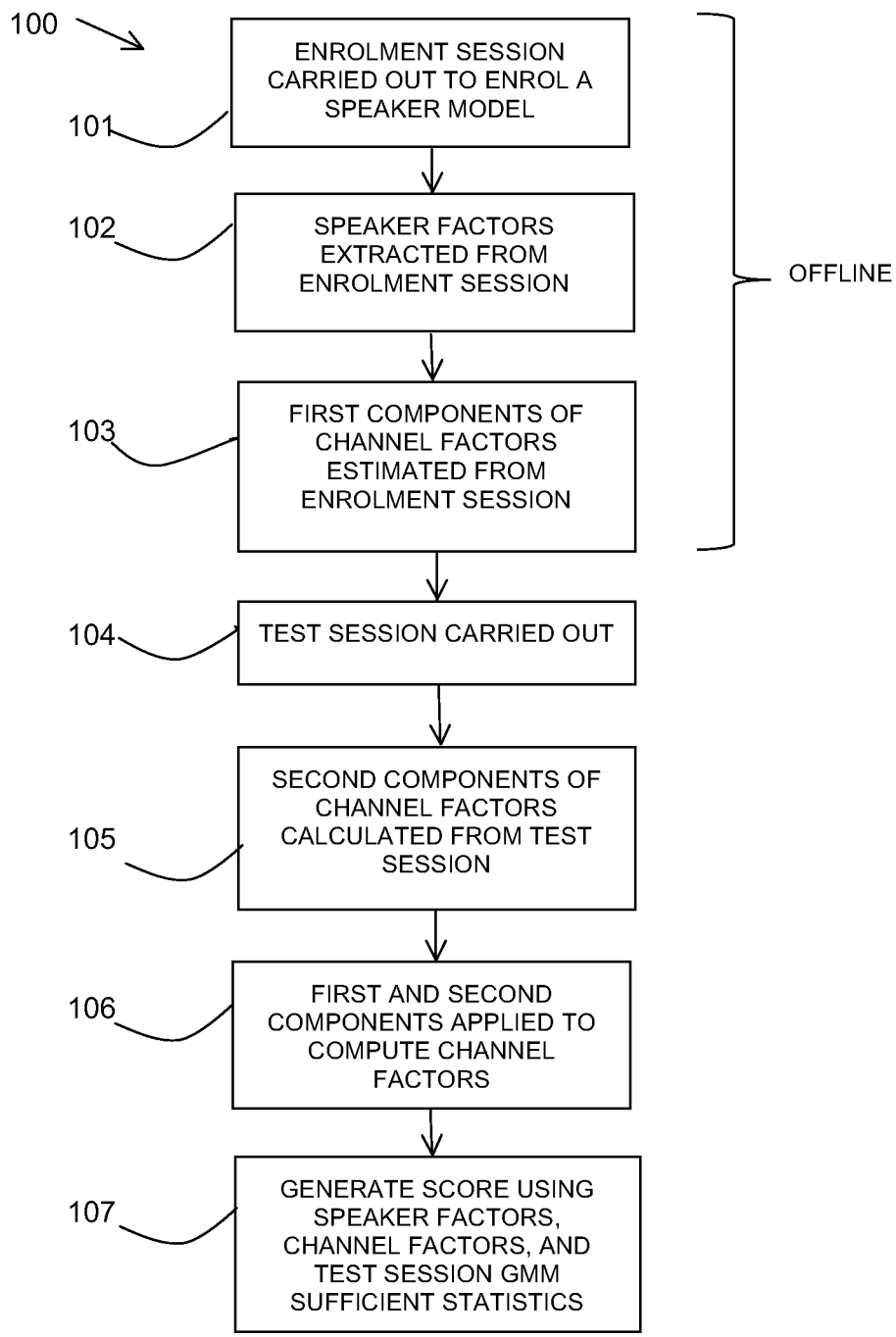
FIG. 1 is a flow diagram of an embodiment of the described method in accordance with the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Joint factor analysis (JFA) is a statistical modelling framework used by state-of-the-art speech processing systems. JFA is used to model the voice of an enrolled speaker and to score verification utterances against an enrolled speaker. In speech processing, given an enrolment session E and a test session T, the goal is to compute a score s(E, T). The way it is done in the literature is that speaker factors (y, z) are extracted for enrolment session E and channel factors are extracted for session T, and then a scoring function is computed using the speaker factors, the channel factors, and the test session GMM (Gaussian mixture model) sufficient statistics.

A computational bottleneck is found in computing the factors (speaker and channel). The time complexity for computing the speaker factors for enrolment session E is of less importance because it is done only once and may be done offline. Therefore, computing the channel factors for the test session T is focused on.

This is done by dividing the computation process into one part that is only loosely dependent on the test session (this is actually the computationally complex part) and a second part which is very strongly dependent on the test session (this part is easy to calculate).

In order to speedup the calculation, the first processing part is approximated by discarding the loose dependency on the test session. This way the first part may be pre-computed. This may be done separately for males and females and separately for short and long sessions.

This approximation results in a speedup factor of 100, that means instead of approximately 2 seconds of computation per test session, only approximately 0.02 seconds are required. Any degradation in accuracy is negligible (0-2% relative, depending on the dataset).

Referring to FIG. 1, a flow diagram 100 shows an embodiment of the described system.

An enrolment or development session may be carried out 101 offline to enrol a speaker model in a speech processing system using JFA such as speaker verification. Speaker factors may be extracted 102 offline from the enrolment session.

In accordance with the described method, first components of channel factors may be estimated 103 from the enrolment session with the estimation being carried out offline. The first components of channel factors may be estimated 103 separately for male/female gender and for short/long sessions. The first components of the channel factors that are estimated may generalize the role of the relevance factor used in UBM-GMM MAP (Gaussian mixture model—universal background model, maximum a posteriori) adaptation and balance between use of prior information and use of observed information.

A test session may then be carried out 104. Second components of channel factors may be calculated 105 which are strongly dependent on the test session.

The first and second components may then be applied 106 to compute the channel factors. A score may be generated 107 using the speaker factors, channel factors, and test session GMM sufficient statistics. The score may calculate the log-likelihood ratio between a target speaker model and the universal background model for a test session.

Background JFA

Joint Factor Analysis (JFA) has become the state-of-the-art technique for many speech processing tasks such as speaker verification, language identification and emotion detection. For speaker verification JFA is used to jointly model speaker and intra-speaker inter-session variabilities. In this framework, each session is represented by its zero, first (and, for some implementations, second) order statistics under a GMM-UBM (Gaussian mixture model—universal background model) framework.

The basic assumption is that a speaker-dependent and channel-dependent supervector of stacked GMM means denoted by M can be decomposed into a sum of two supervectors: a speaker supervector s and a channel supervector c:

$$M=s+c \quad (1)$$

where s and c are normally distributed according to:

$$s=m+Vy+Dz \quad (2)$$

$$c=Ux \quad (3)$$

In Equations (2, 3) m is the supervector corresponding to the UBM, D is a diagonal matrix, V is a rectangular matrix of low rank and y (the speaker factors) and z (the common factors) are independent random vectors having standard normal distributions. U is a rectangular matrix of low rank, x (the channel factors) is a vector distributed with a standard normal distribution. The UBM and the JFA hyper-parameters U, V and D may be estimated from a development data in a process described in P. Kenny, "Joint factor analysis of speaker and session variability: theory and algorithms", technical report CRIM-06/08-14, 2006 (Reference [1]).

The following terms are defined: C is the GMM order, K is the feature vector size, Nc is the data count for Gaussian c, N is a CK×CK diagonal matrix, whose diagonal blocks are $N_c I_K$ ($I_K$ is K×K identity matrix), and F is a CK×1 vector, obtained by concatenating the first order GMM statistics. Given an enrollment session E and a test session T, the sufficient statistics for E and T are represented by $\{N_E, F_E\}$ and $\{N_T, F_T\}$ respectively.

The linear scoring method proposed in O. Glembek, L. Burget, N. Dehak, N. Brummer and P. Kenny, "Comparison of scoring methods used in speaker recognition with joint factor analysis", in *Proc. ICASSP*, 2009 for calculating the log-likelihood ratio (LLR) between the target speaker model E and the UBM, for a test session T is as follows. First, point estimates for the speaker factors $y_E$ and the common factors $z_E$ for enrollment session E are calculated, then point estimates for the channel factors ($x_T$) for test session T are calculated. The point estimates of the factors are obtained either using a closed form solution or using an iterative method. Given the point estimates for the factors and the zero and first order statistics for the test session $\{N_T, F_T\}$, a linear scoring function is used to calculate the LLR:

$$LLR_{lin}=(Vy_E+Dz_E)^t \Sigma^{-1}(F_T-N_T m-N_T U x_T) \quad (4)$$

Approximation

The goal is to reduce the time complexity of the verification phase using an approximation to the standard verification process. That is, given an enrolled speaker model and a test session T, the goal is to efficiently approximate $LLR_{lin}$.

Firstly, the widely used exact maximum likelihood (ML) point estimation method is described, which was originally introduced in detail in Reference [1]. Then the proposed approximation method is described.

Exact ML Estimation of Channel Factors

Given a session T, $X_T=(x_T \; y_T \; z_T)^t$ is a vector of the hidden variables (factors) for T.

According to Theorem 2 in Reference [1], the ML estimate for $X_T$ given T is:

$$\hat{X}_T = L_T^{-1} W^t \Sigma^{-1} F_T$$

where W=(U V D) and $L_T=I+W^t \Sigma^{-1} N_T W$.

The computational complexity of calculating the ML estimates is dominated by the enormous dimensions of $L_T$. As described in Reference [1] $L_T$ can be written as:

$$L_T = \begin{pmatrix} a_T & b_T & c_T \\ b_T^t & I + V^t \Sigma^{-1} N_T V & V^t \Sigma^{-1} N_T D \\ c_T^t & (V^t \Sigma^{-1} N_T D)^t & I + \Sigma^{-1} N_T D^2 \end{pmatrix}$$

where
$a_T = I + U^t \Sigma^{-1} N_T U$
$b_T = U^t \Sigma^{-1} N_T V$
$c_T = U^t \Sigma^{-1} N_T D$
$L_T^{-1}$ can be reformulated as [1]

$$L_T^{-1} = \begin{pmatrix} \zeta_T^{-1} & -\zeta_T^{-1} \beta_T \gamma_T^{-1} \\ -(\zeta_T^{-1} \beta_T \gamma_T^{-1})^t & \gamma_T^{-1} + \gamma_T^{-1} \beta_T^t \zeta_T^{-1} \beta_T \gamma_T^{-1} \end{pmatrix}$$

where $$\beta_T = \begin{pmatrix} c_T \\ V^t \Sigma^{-1} N_T D \end{pmatrix}$$

$\gamma_T = I + \Sigma^{-1} N_T D^2$ $\zeta_T = \alpha_T - \beta_T \gamma_T^{-1} \beta_T^t$ and $$\alpha_T = \begin{pmatrix} a_T & b_T \\ b_T^t & I + V^t \Sigma^{-1} N_T V \end{pmatrix}$$

Now, according to Reference [1], the ML estimate for $X_T$ can be written as:

$$\hat{X}_T = L_T^{-1} W^t \Sigma^{-1} F_T = \begin{pmatrix} J_T \\ -\gamma_T^{-1} \beta_T^t J_T + \gamma_T^{-1} D \Sigma^{-1} F_T \end{pmatrix} \quad (5)$$

where $$J_T = \zeta_T^{-1} \begin{pmatrix} U^t \Sigma^{-1} (F_T - \Sigma^{-1} N_T D^2 \gamma_T^{-1} F_T) \\ V^t \gamma_T^{-1} \Sigma^{-1} F_T \end{pmatrix} \quad (6)$$

In conclusion, in order to compute the ML estimate for $X_T$ it is needed to first calculate $\beta_T$, $\zeta_T^{-1}$ and $\gamma_T^{-1}$, use $\zeta_T^{-1}$ and $\gamma_T^{-1}$ to calculate $J_T$, and finally estimate $X_T$ using Equation (5).

Approximated Estimation of Speaker, Common and Channel Factors.

In order to compute a ML estimate for $X_T$, $\beta_T$, $\zeta_T^{-1}$, and $\gamma_T^{-1}$, must be calculated and then Equations (5, 6) applied. Note that the time complexity of computing $\gamma_T^{-1}$ and applying Equations (5, 6) is negligible compared to the time complexity of computing $\beta_T$ and $\zeta_T^{-1}$.

Examining the expressions in the definitions of $\beta_T$ and $\zeta_T^{-1}$, it is noticed that their dependency on session T is limited to the Gaussian occupancies-based matrix $N_T$.

The key observation here is that $\beta_T$ and $\zeta_T^{-1}$ generalize the role of the relevance factor used in simple UBM-GMM MAP adaptation. That is, they control the estimation process in Equations (5, 6) by balancing between the use of prior information (given by U, D, V and $\Sigma^{-1}$) and the use of the observed information (given by $F_T$ and $N_T$). It turns out that the computation of the generalized relevance factor is the most complex component in the estimation of $X_T$.

It is hypothesized that the accurate estimation of $\beta_T$ and $\zeta_T^{-1}$ may be important for accurate estimation of the common factors because the common subspace is extremely high-dimensional.

For the speaker and channel factors, it is hypothesized that the accurate estimation of β and $\zeta^{-1}$ of less importance due to the relatively low dimensions of the speaker and channel spaces.

Therefore, the following method is proposed to estimate $X_T$. $\beta_T$ and $\zeta_T^{-1}$ are approximated without using session T at all. This is done by replacing the term $N_T$ in the calculation of $\beta_T$ and $\zeta_T^{-1}$ (and consequently $a_T$, $b_T$, $c_T$ and $\alpha_T$) with a session independent approximation of $N_T$. This way, $\beta_T$ and $\zeta_T^{-1}$ can be computed offline.

The approximated values of $\beta_T$ and $\zeta_T^{-1}$ are denoted by β and $\zeta^{-1}$ respectively. Given a test session T, only $\gamma_T^{-1}$ needs to be computed and estimate $X_T$ using the pre-computed values of β and $\zeta^{-1}$.

In one embodiment, $N_T$ is approximated gender dependently by calculating the mean of $N_T$ in a gender dependent development set.

Alternatively, β and $\zeta^{-1}$ may be estimated by computing $\beta_T$ and $\zeta_T^{-1}$ for every session in the development set and calculating their means.

To summarize, a first embodiment of the described method is as follows:

Development Phase (Gender Dependent):
1. Calculate the zero order statistics (matrix N) for every session in the development dataset.
2. Calculate the mean of N→N*.
3. Use N* for calculating β and $\zeta^{-1}$.

Test Phase (Gender Dependent):
1. Calculate the zero and first order statistics (F, N) for the given test session.
2. Calculate $\gamma^{-1}$ using N.
3. Estimate factors according to Equations (5, 6) using $\gamma^{-1}$, F, N, and the pre-calculated β and $\zeta^{-1}$.

All terms except for N (which is the zero order sufficient statistics of the test utterance) are already generated during the enrollment process (calculated offline), i.e. term N is the only information that should be extracted from the test utterance. An approximation for N is obtained by applying mean operation on all zero order sufficient statistics already extracted during development phase. In that way, the approximated N may be calculated offline and calculate β and $\zeta^{-1}$ offline.

Component β and $\zeta^{-1}$ are "loosely" dependent on a given test utterance, hence, they can be computed offline during a development phase by approximating N by its mean N*. However, $\gamma^{-1}$, F, N are "strongly" dependent on test utterance and therefore should be computed during the test phase.

A second embodiment of the described method is as follows:

Development Phase:
1. Estimate β and $\zeta^{-1}$ by computing $\beta_T$ and $\zeta_T^{-1}$ for every session in the development set and calculating their means.

Test Phase (Gender Dependent):
1. Calculate the zero and first order statistics (F, N) for the given test session.
2. Calculate $\gamma^{-1}$ using N.
3. Estimate factors according to Equations (5, 6) using $\gamma^{-1}$, F, N, and the pre-calculated β and $\zeta^{-1}$.

Figure 2:
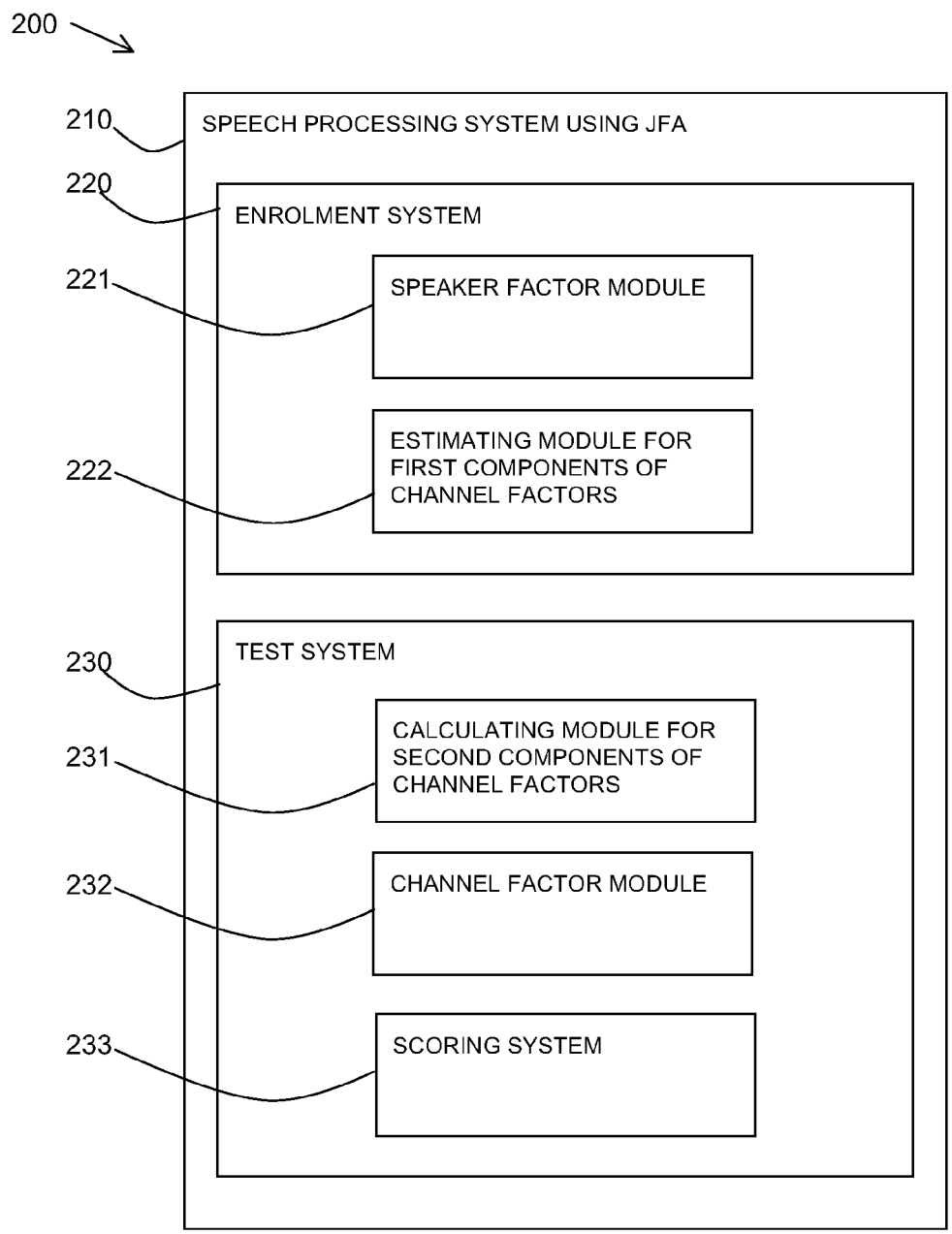
FIG. 2 is a block diagram of an embodiment of a system in accordance with the present invention.

Referring to FIG. 2, a block diagram 200 shows an embodiment of the described system. A speech processing system 210 is provided using JFA, for example, for speech verification.

An enrolment system 220 may be provided for enrolling a speaker model during an enrolment session carried out offline. A speaker factor module 221 may be provided for extracting speaker factors from an enrolment session. An estimating module 222 may also be provided for estimating first components of channel factors from the enrolment session.

A test system 230 may be provided for carrying out speaker processing online during test sessions. The test system 230 may include a calculating module 231 for calculating second components of channel factors from the test sessions. A channel factor module 232 may be provided for combining the first and second channel factor components.

A scoring system 233 may be provided for generating a score for the speech processing using the speaker factors, channel factors, and test session GMM sufficient statistics. The score may calculate the log-likelihood ratio between a target speaker model and the universal background model for a test session.

Figure 3:
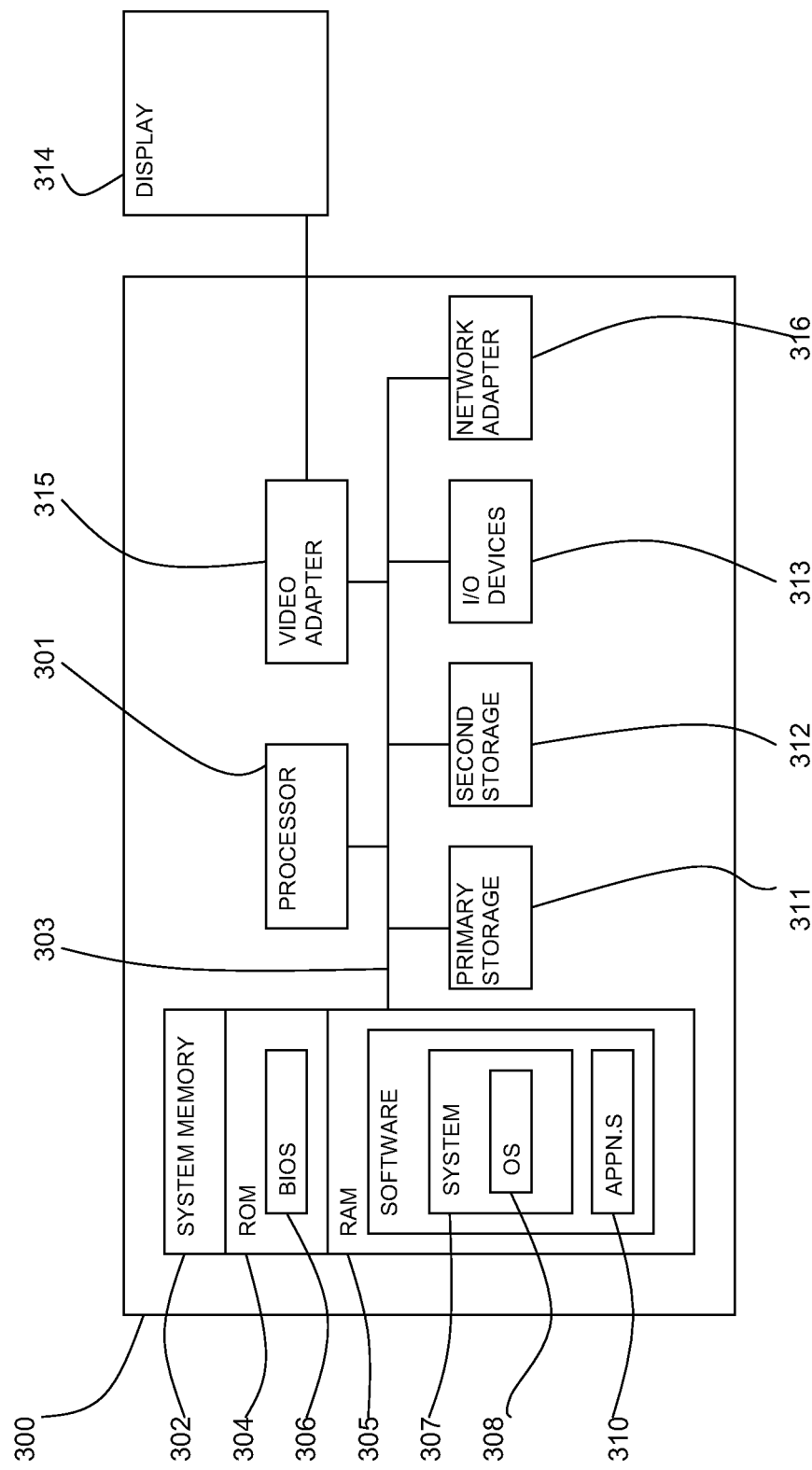
FIG. 3 is a block diagram of a computer system in which the present invention may be implemented.

Referring to FIG. 3, an exemplary system for implementing aspects of the invention includes a data processing system 300 suitable for storing and/or executing program code including at least one processor 301 coupled directly or indirectly to memory elements through a bus system 303. The memory elements can include local memory employed during actual execution of the program code, bulk storage, and cache memories which provide temporary storage of at least some program code in order to reduce the number of times code must be retrieved from bulk storage during execution.

The memory elements may include system memory 302 in the form of read only memory (ROM) 304 and random access memory (RAM) 305. A basic input/output system (BIOS) 306 may be stored in ROM 304. System software 307 may be stored in RAM 305 including operating system software 308. Software applications 310 may also be stored in RAM 305.

The system 300 may also include a primary storage means 311 such as a magnetic hard disk drive and secondary storage means 312 such as a magnetic disc drive and an optical disc drive. The drives and their associated computer-readable media provide non-volatile storage of computer-executable instructions, data structures, program modules and other data for the system 300. Software applications may be stored on the primary and secondary storage means 311, 312 as well as the system memory 302.

The computing system 300 may operate in a networked environment using logical connections to one or more remote computers via a network adapter 316.

Input/output devices 313 can be coupled to the system either directly or through intervening I/O controllers. A user may enter commands and information into the system 300 through input devices such as a keyboard, pointing device, or other input devices (for example, microphone, joy stick, game pad, satellite dish, scanner, or the like). Output devices may include speakers, printers, etc. A display device 314 is also connected to system bus 303 via an interface, such as video adapter 315.

An approach is described for efficient approximation estimation of speaker, common and channel factors. Using the described method it is possible to efficiently score a given test session with a very small degradation in accuracy whilst speeding up the process by a factor of approximately 100.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer-implemented method for Joint Factor Analysis (JFA) scoring in speech processing systems performed by a computerized device, comprising:
    carrying out an enrollment session offline to enroll a speaker model in a speech processing system using JFA, including:
        providing an equation for calculating a score representative of the extent to which a speaker of a received test speech signal matches an enrolled speaker, based on speaker factors, a first component of channel factors which loosely depend on the test speech signal and a second component of channel factors which strongly depend on the test speech signal;
        receiving an enrollment speech signal from a user;
        extracting the speaker factors from the enrollment speech signal;
        estimating one or more values of the first component of channel factors from the enrollment speech signal, without using a test speech signal;
    carrying out a test session including:
        receiving a test speech signal;
        retrieving an estimated first component of channel factors which was estimated in the enrollment session without using the test speech signal, for the received test speech signal;
    calculating the second component of channel factors strongly dependent on the test session, based on the test speech signal; and
    generating a score based on the provided equation, the speaker factors, the estimated first component and the calculated second component of channel factors.

2. The method as claimed in claim 1, wherein estimating one or more values of the first component of channel factors is carried out separately for a plurality of genders, based on a plurality of different enrollment speech signals belonging to speakers of different genders.

3. The method as claimed in claim 1, wherein estimating one or more values of the first component of channel factors is carried out separately for a plurality of different durations of sessions, based on a plurality of different enrollment speech signals of different durations.

4. The method as claimed in claim 1, wherein the speech processing is speaker verification and generating a score calculates a log-likelihood ratio between a target speaker model and the universal background model for a test session.

5. The method as claimed in claim 1, wherein the first component of the channel factors generalizes the role of the relevance factor used in a universal background model, Gaussian mixture model maximum a posteriori (UBM-GMM MAP) adaptation.

6. The method as claimed in claim 1, wherein the first and second components are components needed to calculate the posterior expectation of factors.

7. The method as claimed in claim 1, wherein:
    estimating one or more values of the first component of channel factors comprises calculating the zero order statistics (matrix N) for a plurality of enrollment speech signals;
    calculating the mean of the calculated zero order statistics (matrix N); and
    using the mean of matrix N for calculating the first components.

8. The method as claimed in claim 1, estimating one or more values of the first component of channel factors comprises
    estimating first components, $\beta$ and $\zeta^{-1}$ of a linear scoring method equation by computing the first components $\beta_T$ and $T^1$ for a plurality of enrollment speech signals and calculating their means.

9. The method as claimed in claim 8, wherein the test session includes:
    calculating the zero and first order statistics (F, N) for the enrollment speech;
    calculating the second component of the channel factors $\gamma^{-1}$ using N; and
    estimating channel factors using the second component $\gamma^{-1}$, the zero and first order statistics F, N, and the pre-calculated first components $\beta$ and $\zeta^{-1}$.

10. A computer program product for Joint Factor Analysis (JFA) scoring in speech processing systems, embodied in a computer readable non-transitory storage medium the computer readable program product comprising:
    computer readable program code configured to:
        carry out an enrollment session offline to enroll a speaker model in a speech processing system using JFA, including:
            providing an equation for calculating a score representative of the extent to which a speaker of a received test speech signal matches an enrolled speaker, based on speaker factors, a first component of channel factors which loosely depend on the test speech signal and a second component of channel factors which strongly depend on the test speech signal;

receiving an enrollment speech signal from a user;

extracting the speaker factors from the enrollment speech signal;

estimating one or more values of the first components component of channel factors from the enrolment enrollment speech signal, without using a test speech signal session; and carry out a test session including:

receiving a test speech signal;

retrieving an estimated first component of channel factors which was estimated in the enrollment session without using the test speech signal, for the received test speech signal;

calculating the second component of channel factors strongly dependent on the test session, based on the test speech signal; and generating a score based on the provided equation, the speaker factors, the estimated first component and the calculated second component of channel factors.

11. A system for Joint Factor Analysis (JFA) scoring in a speech processing system, comprising:

a processor;

an enrollment system for carrying out an enrollment session offline to enroll a speaker model in a speech processing system using JFA, including:

providing an equation for calculating a score representative of the extent to which a speaker of a received test speech signal matches an enrolled speaker, based on speaker factors, a first component of channel factors which loosely depend on the test speech signal and a second component of channel factors which strongly depend on the test speech signal;

receiving an enrollment speech signal from a user;

extracting the speaker factors from the enrollment speech signal; and estimating one or more values of the first component of channel factors from the enrollment speech signal, without using a test speech signal; and a test system for carrying out a test session including:

receiving a test speech signal;

retrieving an estimated first component of channel factors which was estimated in the enrollment session without using the test speech signal, for the received test speech signal;

calculating the second component of channel factors strongly dependent on the test session, based on the test speech signal; and generating a score based on the provided equation, the speaker factors, the estimated first component and the calculated second component of channel factors.

12. The method as claimed in claim 1, wherein estimating one or more values of the first component of channel factors comprises computing the first components for a plurality of enrollment speech signals and calculating a mean of the computed first components.

13. The method of claim 1, wherein the equation is a test session Gaussian mixture model equation sufficient to provide a log-likelihood ratio for a test session.

14. The method of claim 1, wherein providing the equation comprises providing an equation in accordance with a linear scoring method.

* * * * *